(12) United States Patent
Cody et al.

(10) Patent No.: US 12,315,722 B2
(45) Date of Patent: May 27, 2025

(54) METHOD FOR MAKING A RADIO FREQUENCY SILICON-ON-INSULATOR (RFSOI) WAFER INCLUDING A SUPERLATTICE

(71) Applicant: Atomera Incorporated, Los Gatos, CA (US)

(72) Inventors: Nyles Wynn Cody, Tempe, AZ (US); Keith D. Weeks, Chandler, AZ (US); Robert Michael Vyne, Chandler, AZ (US); Robert J. Stephenson, Duxford (GB)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/604,620

(22) Filed: Mar. 14, 2024

(65) Prior Publication Data

US 2024/0312781 A1    Sep. 19, 2024

Related U.S. Application Data (60) Provisional application No. 63/490,119, filed on Mar. 14, 2023.

(51) Int. Cl.
*H01L 21/02* (2006.01)
*H01L 21/3065* (2006.01)
*H01L 21/324* (2006.01)

(52) U.S. Cl.
CPC .... *H01L 21/02488* (2013.01); *H01L 21/0245* (2013.01); *H01L 21/3065* (2013.01); *H01L 21/324* (2013.01)

(58) Field of Classification Search
None
See application file for complete search history.

(56) References Cited

U.S. PATENT DOCUMENTS

| | | |
|---|---|---|
| 4,937,204 A | 6/1990 | Ishibashi et al. |
| 5,216,262 A | 6/1993 | Tsu |

(Continued)

FOREIGN PATENT DOCUMENTS

| | | |
|---|---|---|
| EP | 1936670 | 6/2008 |
| GB | 2347520 | 6/2000 |
| TW | 201225158 | 6/2012 |

OTHER PUBLICATIONS

R. Tsu "Phenomena in silicon nanostructure device" published online Sep. 6, 2000 by Applied Physics and Materials Science & Processing, pp. 391-402.

(Continued)

*Primary Examiner* — Khaja Ahmad
(74) *Attorney, Agent, or Firm* — ALLEN, DYER, DOPPELT, + GILCHRIST, P.A.

(57) ABSTRACT

A method for making a semiconductor device may include, in an epitaxial deposition tool, performing an anneal on a semiconductor on insulator (SOI) substrate including a first semiconductor layer, an insulating layer on the first semiconductor layer, and a second semiconductor layer on the insulating layer, the second semiconductor layer having a first thickness. The method may also include, in the epitaxial deposition tool, performing an in-situ etch to reduce the second semiconductor layer to a second thickness less than the first thickness, and forming a superlattice layer on the second semiconductor layer. The superlattice layer may include a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

19 Claims, 10 Drawing Sheets

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,143,629 A * | 11/2000 | Sato ............... H01L 21/76262 257/E21.216 |
| 6,376,337 B1 | 4/2002 | Wang et al. |
| 6,447,933 B1 | 9/2002 | Wang et al. |
| 6,472,685 B2 | 10/2002 | Takag |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,332,417 B2 * | 2/2008 | Westhoff ........... H01L 21/02507 438/455 |
| 7,402,512 B2 | 7/2008 | Derraa et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,716,147 B2 | 7/2017 | Mears |
| 9,721,790 B2 | 8/2017 | Mears et al. |
| 9,722,046 B2 | 8/2017 | Mears et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 11,075,078 B1 | 7/2021 | Cody et al. |
| 11,094,818 B2 | 8/2021 | Takeuchi et al. |
| 11,177,351 B2 | 11/2021 | Weeks et al. |
| 11,183,565 B2 | 11/2021 | Burton et al. |
| 11,302,823 B2 | 4/2022 | Weeks et al. |
| 11,329,154 B2 | 5/2022 | Takeuchi et al. |
| 11,355,667 B2 | 6/2022 | Stephenson |
| 11,362,182 B2 | 6/2022 | Shin et al. |
| 11,387,325 B2 | 7/2022 | Stephenson et al. |
| 11,430,869 B2 | 8/2022 | Weeks et al. |
| 11,437,486 B2 | 9/2022 | Burton |
| 11,437,487 B2 | 9/2022 | Burton |
| 11,469,302 B2 | 10/2022 | Takeuchi et al. |
| 11,569,368 B2 | 1/2023 | Takeuchi et al. |
| 11,631,584 B1 | 4/2023 | Hytha et al. |
| 11,664,427 B2 | 5/2023 | Stephenson et al. |
| 11,664,459 B2 | 5/2023 | Stephenson |
| 11,682,712 B2 | 6/2023 | Hytha et al. |
| 11,721,546 B2 | 8/2023 | Hytha et al. |
| 11,728,385 B2 | 8/2023 | Hytha et al. |
| 11,742,202 B2 | 8/2023 | Takeuchi et al. |
| 11,810,784 B2 | 11/2023 | Hytha et al. |
| 11,837,634 B2 | 12/2023 | Weeks et al. |
| 11,848,356 B2 | 12/2023 | Weeks et al. |
| 11,869,968 B2 | 1/2024 | Takeuchi et al. |
| 11,923,418 B2 | 3/2024 | Hytha et al. |
| 11,923,431 B2 | 3/2024 | Burton |
| 11,935,940 B2 | 3/2024 | Burton |

(56) References Cited

U.S. PATENT DOCUMENTS

| | | |
|---|---|---|
| 2003/0034529 A1 | 2/2003 | Fitzgerald et al. |
| 2003/0057416 A1 | 3/2003 | Currie et al. |
| 2004/0262594 A1 | 12/2004 | Mears et al. |
| 2004/0266116 A1 | 12/2004 | Mears |
| 2005/0029510 A1 | 2/2005 | Mears et al. |
| 2005/0032241 A1 | 2/2005 | Mears et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Stephenson et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2009/0001329 A1* | 1/2009 | Atanackovic .......... H10D 64/68 252/521.1 |
| 2010/0270535 A1 | 10/2010 | Halilov et al. |
| 2011/0215299 A1 | 9/2011 | Rao |
| 2012/0244679 A1* | 9/2012 | Oka .................... H01L 21/3065 257/E21.122 |
| 2013/0052799 A1 | 2/2013 | Ohki |
| 2013/0168835 A1 | 7/2013 | Botula et al. |
| 2016/0336215 A1* | 11/2016 | Mougel ............ H01L 21/76254 |
| 2019/0058059 A1 | 2/2019 | Stephenson et al. |
| 2019/0273015 A1* | 9/2019 | Wang ................ H01L 21/76251 |
| 2019/0319135 A1* | 10/2019 | Stephenson ....... H01L 29/78687 |
| 2020/0135489 A1 | 4/2020 | Weeks et al. |
| 2022/0005706 A1 | 1/2022 | Weeks et al. |
| 2022/0278204 A1 | 9/2022 | Shin et al. |
| 2022/0285152 A1 | 9/2022 | Takeuchi et al. |
| 2022/0352322 A1 | 11/2022 | Hytha et al. |
| 2022/0367676 A1 | 11/2022 | Burton |
| 2022/0376047 A1 | 11/2022 | Mears et al. |
| 2022/0384600 A1 | 12/2022 | Mears et al. |
| 2023/0121774 A1 | 4/2023 | Weeks et al. |
| 2023/0122723 A1 | 4/2023 | Weeks et al. |
| 2023/0352299 A1 | 11/2023 | Takeuchi et al. |
| 2023/0361178 A1 | 11/2023 | Hytha et al. |
| 2023/0395374 A1 | 12/2023 | Hytha et al. |
| 2023/0411491 A1 | 12/2023 | Hytha et al. |
| 2023/0411557 A1 | 12/2023 | Hytha et al. |
| 2024/0063268 A1 | 2/2024 | Weeks et al. |
| 2024/0072095 A1 | 2/2024 | Takeuchi et al. |
| 2024/0072096 A1 | 2/2024 | Takeuchi et al. |

OTHER PUBLICATIONS

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/ http://www3.interscience.wiley.com/cgi-bin/abstract/72512946/ start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) p. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, p. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/# EE Times; retreived from internet Feb. 10, 2022; p. 3.

* cited by examiner

METHOD FOR MAKING A RADIO FREQUENCY SILICON-ON-INSULATOR (RFSOI) WAFER INCLUDING A SUPERLATTICE

CROSS-REFERENCE TO RELATED APPLICATIONS

This application claims the benefit of U.S. Provisional App. No. 63/490,119 filed Mar. 14, 2023, which is hereby incorporated herein in its entirety by reference.

TECHNICAL FIELD

The present disclosure generally relates to semiconductor devices, and, more particularly, to semiconductor-on-insulator (SOI) wafer and device fabrication.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include, in an epitaxial deposition tool, performing an anneal on a semiconductor on insulator (SOI) substrate including a first semiconductor layer, an insulating layer on the first semiconductor layer, and a second semiconductor layer on the insulating layer, with the second semiconductor layer having a first thickness. The method may also include, in the epitaxial deposition tool, performing an in-situ etch to reduce the second semiconductor layer to a second thickness less than the first thickness, and forming a superlattice layer on the second semiconductor layer. The superlattice layer may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions.

In an example implementation, the first thickness may be in a range of 30 nm to 90 nm, and the second thickness may be in a range of 10 nm to 20 nm. Performing the anneal may comprise annealing the SOI substrate at a temperature greater than 1000° C., and in a hydrogen environment, for example.

Also by way of example, the in-situ etch may comprise performing an in-situ HCl etch with an HCl gas flow in a range of 100-1000 sccm. In an example implementation, the in-situ etch may be performed at a temperature in a range of 900-1200° C., and at an etch rate in a range of 5-200 nm per minute.

In some embodiments, the method may also include epitaxially forming a third semiconductor layer on the superlattice layer, and forming at least one semiconductor circuit in the third semiconductor layer. By way of example, the base semiconductor monolayers may comprise silicon, and the non-semiconductor monolayers may comprise oxygen.

DETAILED DESCRIPTION

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. In prior work, Applicant theorized that certain superlattices as described herein reduce the effective mass of charge carriers and that this thereby leads to higher charge carrier mobility. See, e.g., U.S. Pat. No. 6,897,472, which is hereby incorporate herein in its entirety by reference.

Further development by Applicant has established that the presence of MST layers may advantageously improve the mobility of free carriers in semiconductor materials, e.g., at interfaces between silicon and insulators like $SiO_2$ or $HfO_2$. Applicant theorizes, without wishing to be bound thereto, that this may occur due to various mechanisms. One mechanism is by reducing the concentration of charged impurities proximate to the interface, by reducing the diffusion of these impurities, and/or by trapping the impurities so they do not reach the interface proximity. Charged impurities cause Coulomb scattering, which reduces mobility. Another mechanism is by improving the quality of the interface. For example, oxygen emitted from an MST film may provide oxygen to a $Si$—$SiO_2$ interface, reducing the presence of sub-stoichiometric $SiO_x$. Alternately, the trapping of interstitials by MST layers may reduce the concentration of interstitial silicon proximate to the $Si$—$SiO_2$ interface, reducing the tendency to form sub-stoichiometric $SiO_x$. Sub-stoichiometric $SiO_2$, at the $Si$—$SiO_2$ interface is known to exhibit inferior insulating properties relative to stoichiometric $SiO_2$. Reducing the amount of sub-stoichiometric $SiO_x$ at the interface more effectively confines free carriers (electrons or holes) in the silicon, and thus improves the mobility of these carriers due to electric fields applied parallel to the interface, as is standard practice in field-effect-transistor ("FET") structures. Scattering due to the direct influence of the interface is called "surface-roughness scattering", which may advantageously be reduced by the proximity of MST layers followed by anneals or during thermal oxidation.

In addition to the enhanced mobility characteristics of MST structures, they may also be formed or used in such a manner that they provide piezoelectric, pyroelectric, and/or ferroelectric properties that are advantageous for use in a variety of different types of devices, as will be discussed further below.

Figure 1:
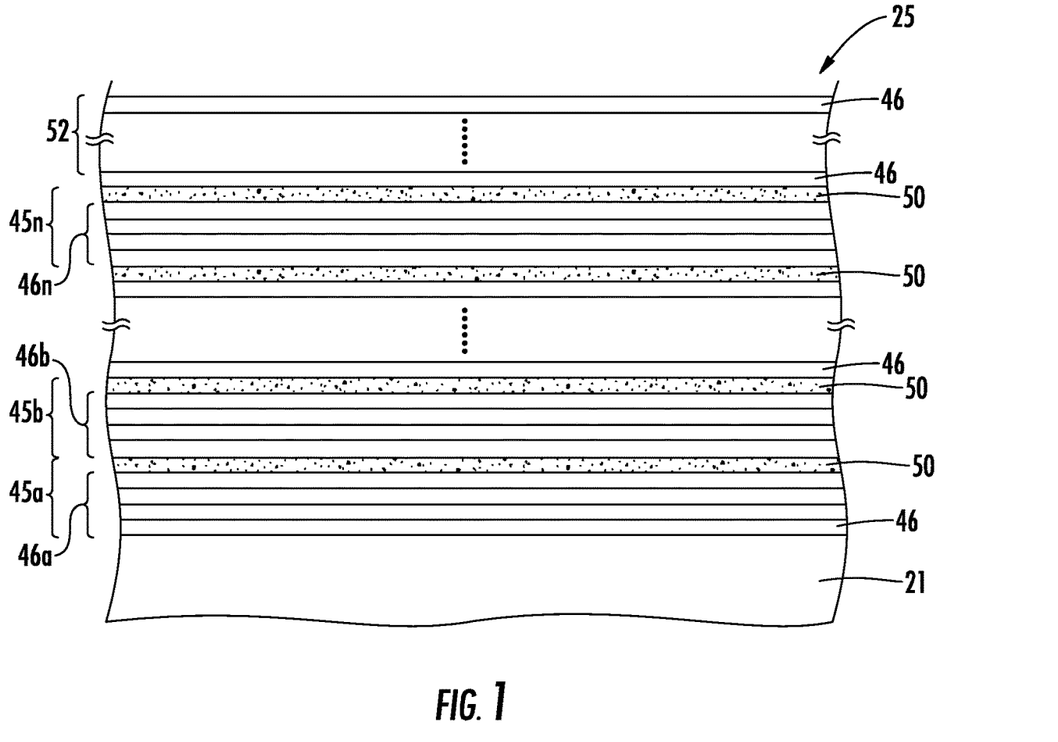
FIG. 1 is a greatly enlarged schematic cross-sectional view of a superlattice for use in a semiconductor device in accordance with an example embodiment.
Figure 2:
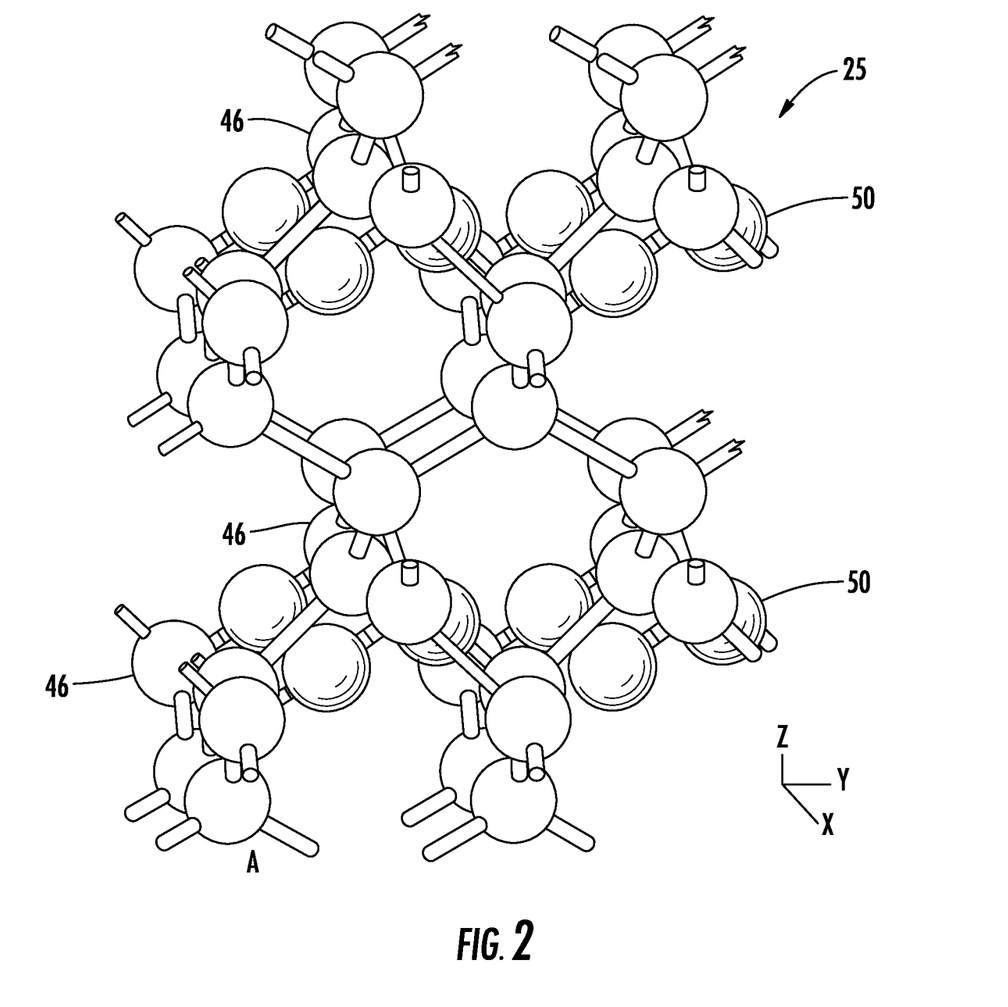
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and a non-semiconductor monolayer(s) 50 thereon. The non-semiconductor monolayers 50 are indicated by stippling in FIG. 1 for clarity of illustration.

The non-semiconductor monolayer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that non-semiconductor monolayers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each non-semiconductor monolayer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the non-semiconductor monolayer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

Figure 3:
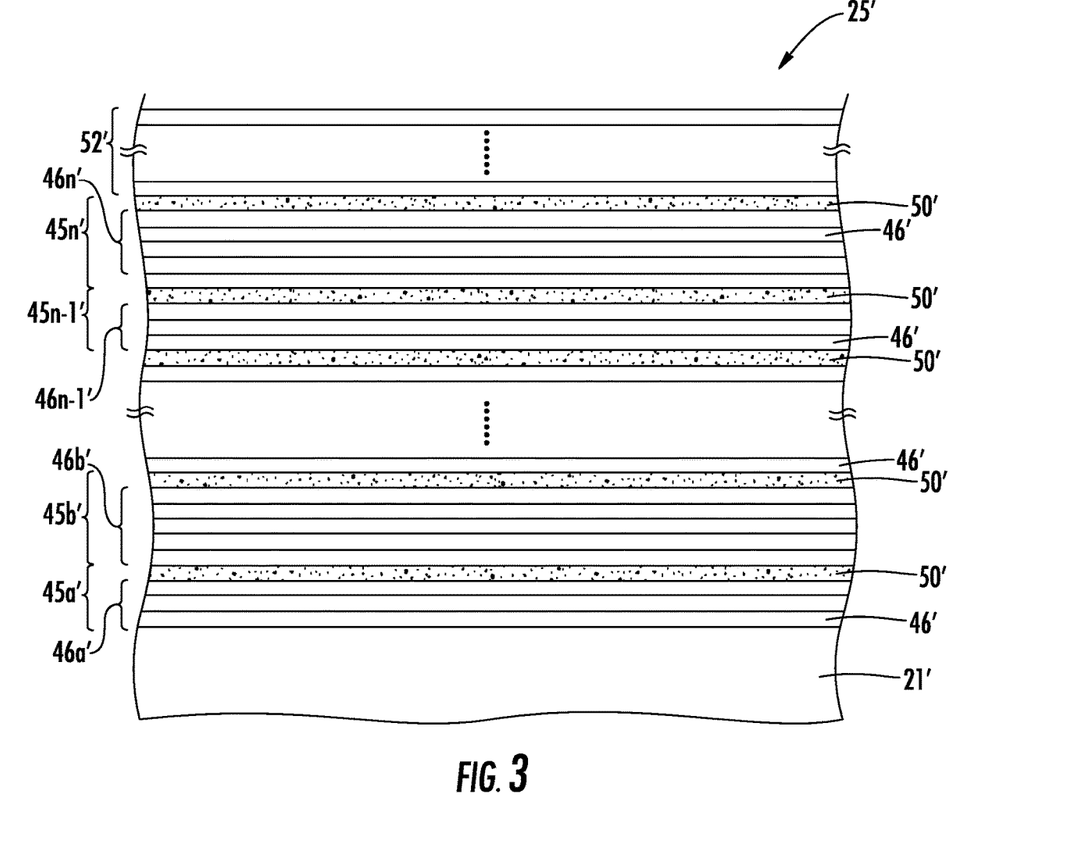
FIG. 3 is a greatly enlarged schematic cross-sectional view of another embodiment of a superlattice in accordance with an example embodiment.

Referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The non-semiconductor monolayers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
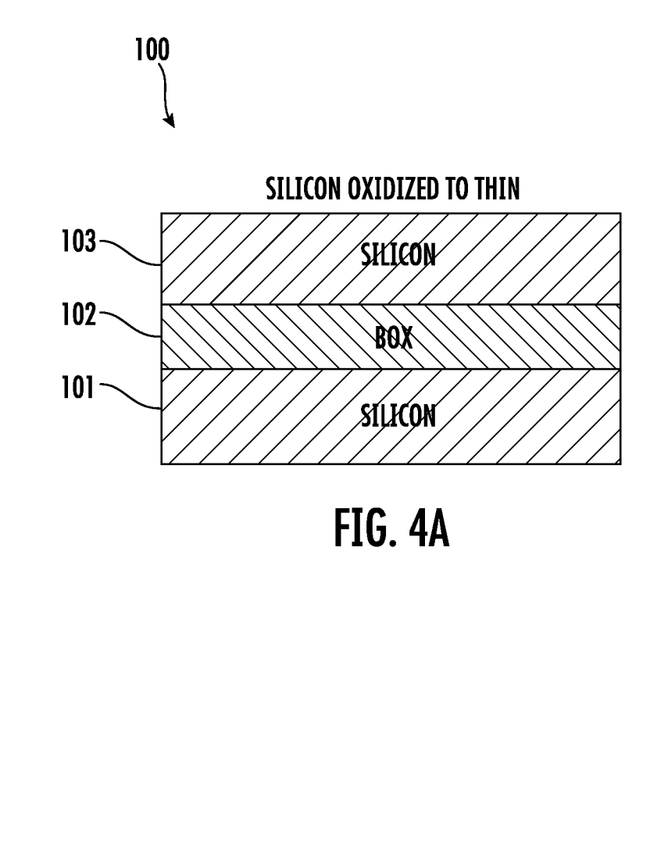
FIGS. 4A and 4B are a series of schematic cross-sectional diagrams illustrating a conventional approach to SOI wafer formation.
Figure 4B:
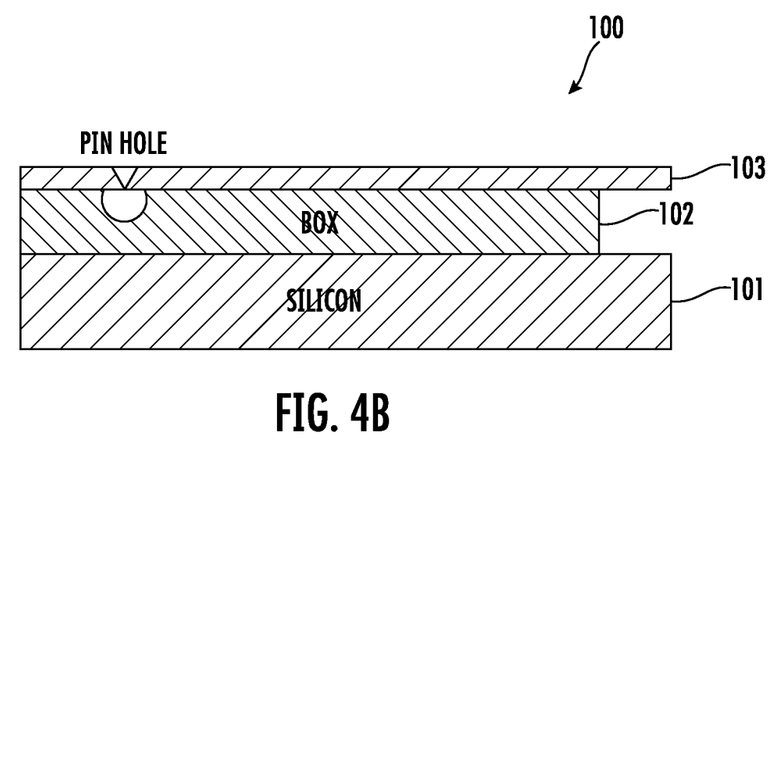

Turning now to FIGS. 4A and 4B, by way of background, typical processes for SOI wafer 30 formation involve thinning the silicon layer 103 on the buried oxide (BOX) layer 102 (which is above a silicon substrate 101) using a single or multiple oxidation steps, followed by HF stripping.

Several irregularities may occur in the silicon layer 103 during this process, including the formation of pin holes, etching of the oxide under the pin hole, and undercutting of the BOX layer 102. These irregularities lead to defects that get incorporated into the subsequent MST film growth. Defects are generated at the edge of the wafer 100 due to the undercutting of the BOX layer 102 and are transported to the surface of the wafer during the HF wafer clean (See FIG. 4B).

Figure 5:
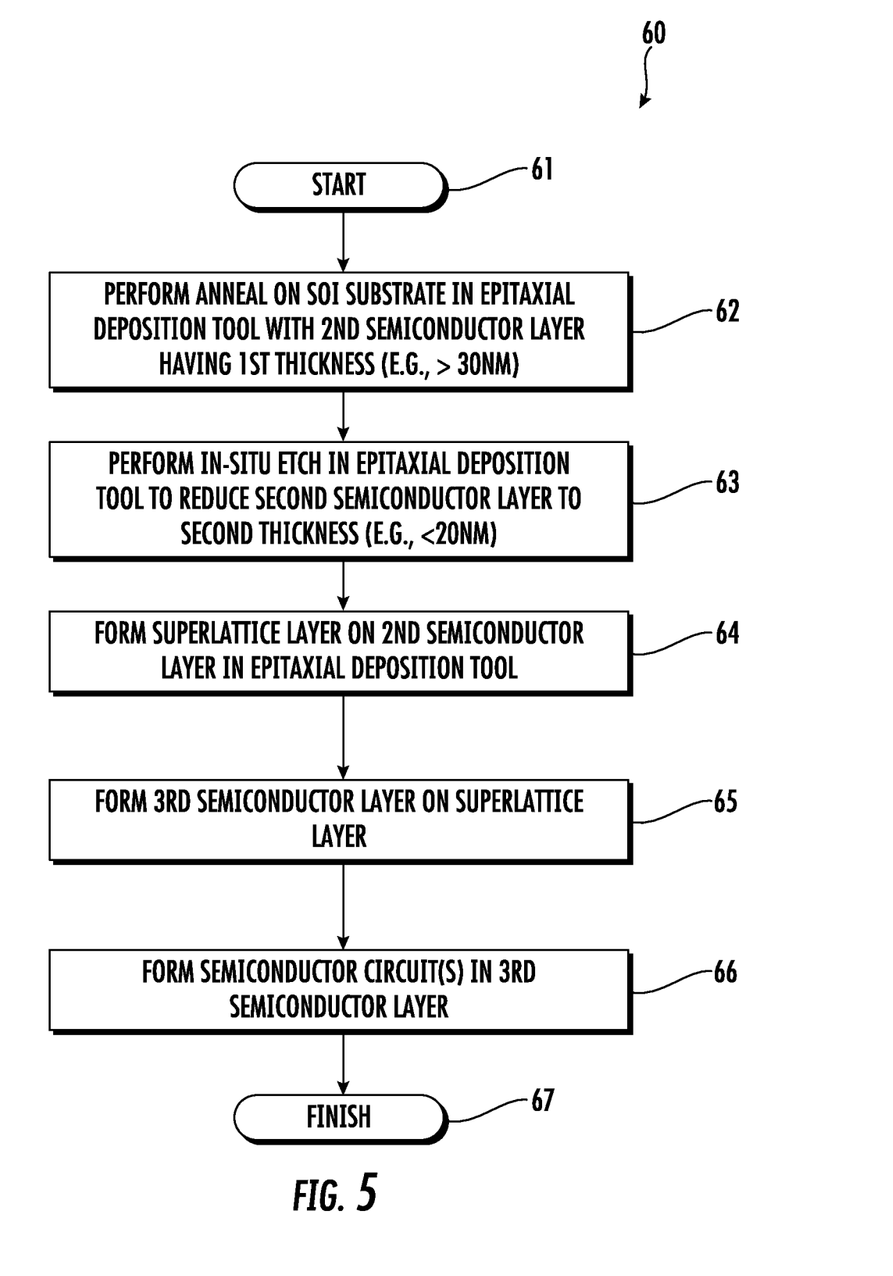
FIG. 5 is a flow diagram illustrating a method for making a semiconductor device including a superlattice in accordance with an example embodiment.

Referring additionally to the flow diagram 60 of FIG. 5, an example approach for forming SOI wafers to provide for reduced defects in the fabrication of the above-described MST films is now described. More particularly, to overcome the above-described deficiencies of conventional SOI wafer formation, the present approach allows for annealing and thinning of SOI wafers in the same epitaxial deposition (epi) tool in which the MST film is grown to avoid the formation of pin holes and undercutting of the silicon on the BOX. This may allow for a cleaner process and customizable silicon thickness for different wafers, among other technical advantages.

To maximize the benefits of the MST films for RFSOI devices, it may be desirable to position the MST film around 10-20 nm above the BOX layer. However, the above-described limitations of conventional BOX formation generally prevent SOI wafers with a silicon layer this thin on the BOX layer. Beginning at Block 61, and referring to the wafer 100 of FIG. 4A, starting with a silicon thickness of the layer 103 greater than 30 nm allows for a high temperature bake or anneal (e.g., greater than 1000° C.) in a hydrogen environment to remove the native oxide from the silicon thickness, at Block 62. The method further illustratively includes an in-situ etch (e.g., an HCl etch) in the epi tool to thin the silicon layer to a second thickness (Block 63), followed by MST film deposition, at Block 64. Using this approach, RFSOI substrates with silicon layer 103 thicknesses in the 10-20 nm (or otherwise) and desired uniformity may advantageously be achieved. In some embodiments, the completed wafer may be the end product, or further processing may form a third (active) semiconductor layer (e.g., the cap layer 52) on the superlattice 25 (Block 65), and circuitry (e.g., RF circuitry) in the third semiconductor layer (Block 66), as will be appreciated by those skilled in the art. The method of FIG. 5 illustratively concludes at Block 67.

Typical HCl etching of silicon is done at an elevated temperature, e.g., 900-1200° C., and using atmospheric conditions. For the present approach, the etch rate may be tuned to controllably target a given silicon thickness, typically on the order of 10-20 nm. The starting silicon thickness available on typical SOI wafers is at a minimum of 30 nm and up to a few microns in thickness. For this approach, the starting thickness will be 30-90 nm, and a relatively slow etch rate may be used (e.g., on the order of 5-50 nm per minute). Additionally, the etching of the silicon preferably maintains a smooth surface so that subsequent devices/circuitry can be manufactured in the silicon. To maintain smooth surfaces, relatively high temperatures and a low HCl gas ratio in hydrogen are used.

More particularly, the foregoing will be further understood with reference to example implementations now described with reference to FIGS. 6A, 6B, and 7-10. Several tests of the above-described silicon smoothing/etching process were performed using an ATM process for different bake temperatures of 900-1050° C., and using a relatively low percentage of HCl<5% in hydrogen. The results are summarized in Table 1 below. Generally speaking, higher temperatures result in a higher etch rate. The test started with two minutes at 900° C. and one minute at 1000° C., and the temperature was varied as shown. A ratio of $H_2$ to HCL was set at 40:1, and the initial tests were run on P− wafers for surface quality evaluation. By way of reference, defect etch is an ATM process at 750° C. with fifteen liters HCL and five liters $H_2$. Moreover, chamber clean is an ATM process at 1150° C. with eighteen liters of HCl and 25-60 liters of $H_2$. The results shown in Table 1 demonstrate that higher temperatures give lower haze, and generally lower particle levels (though some fluctuations in particle levels occurred).

TABLE 1

| Etch Temp | Time | Defects | Haze |
| --- | --- | --- | --- |
| 900 | 120 | 1518 | 6.41 |
| 925 | 105 | 6340 | 0.867 |
| 950 | 90 | 275 | 0.5 |
| 975 | 75 | 194 | 0.36 |
| 1000 | 60 | 904 | 0.268 |
| Reference Wafer | | 15 | 0.235 |

Figure 6A:
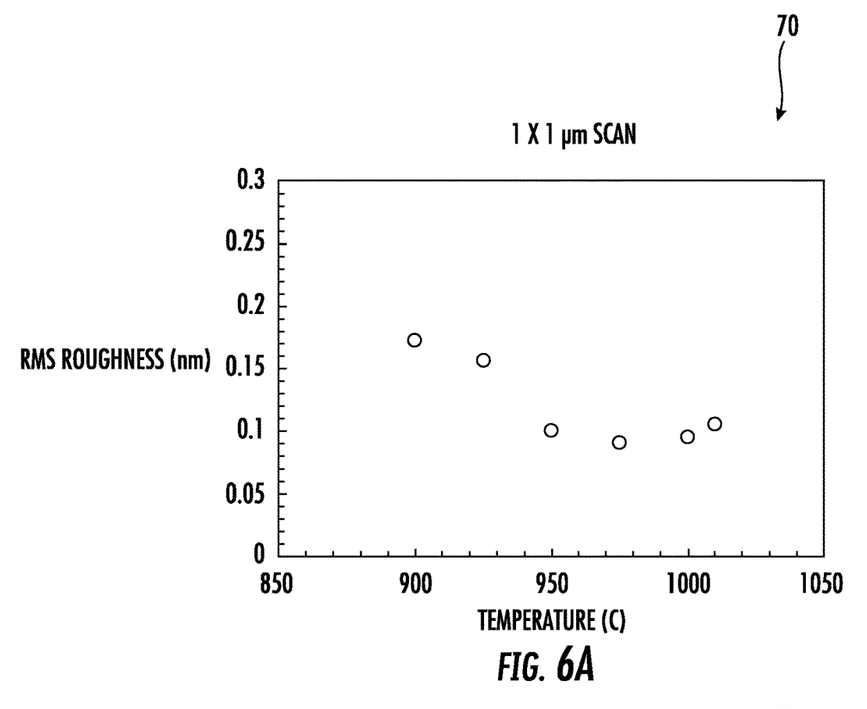
FIGS. 6A, 6B are a series of graphs illustrating RMS roughness vs. temperature for different surface area size ranges associated with example in-situ etch parameters for the method of FIG. 5.
Figure 6B:
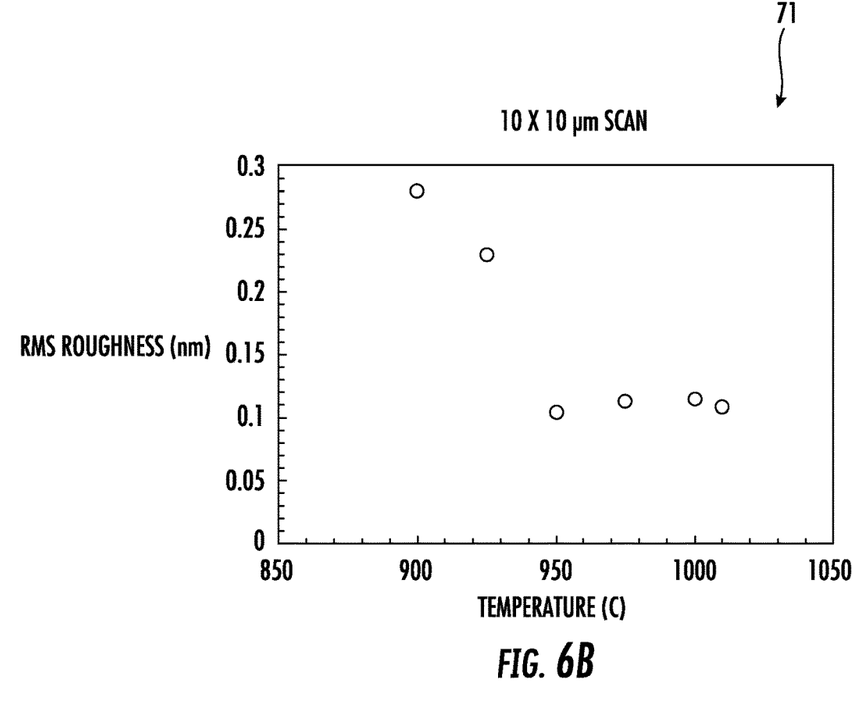
Figure 7:
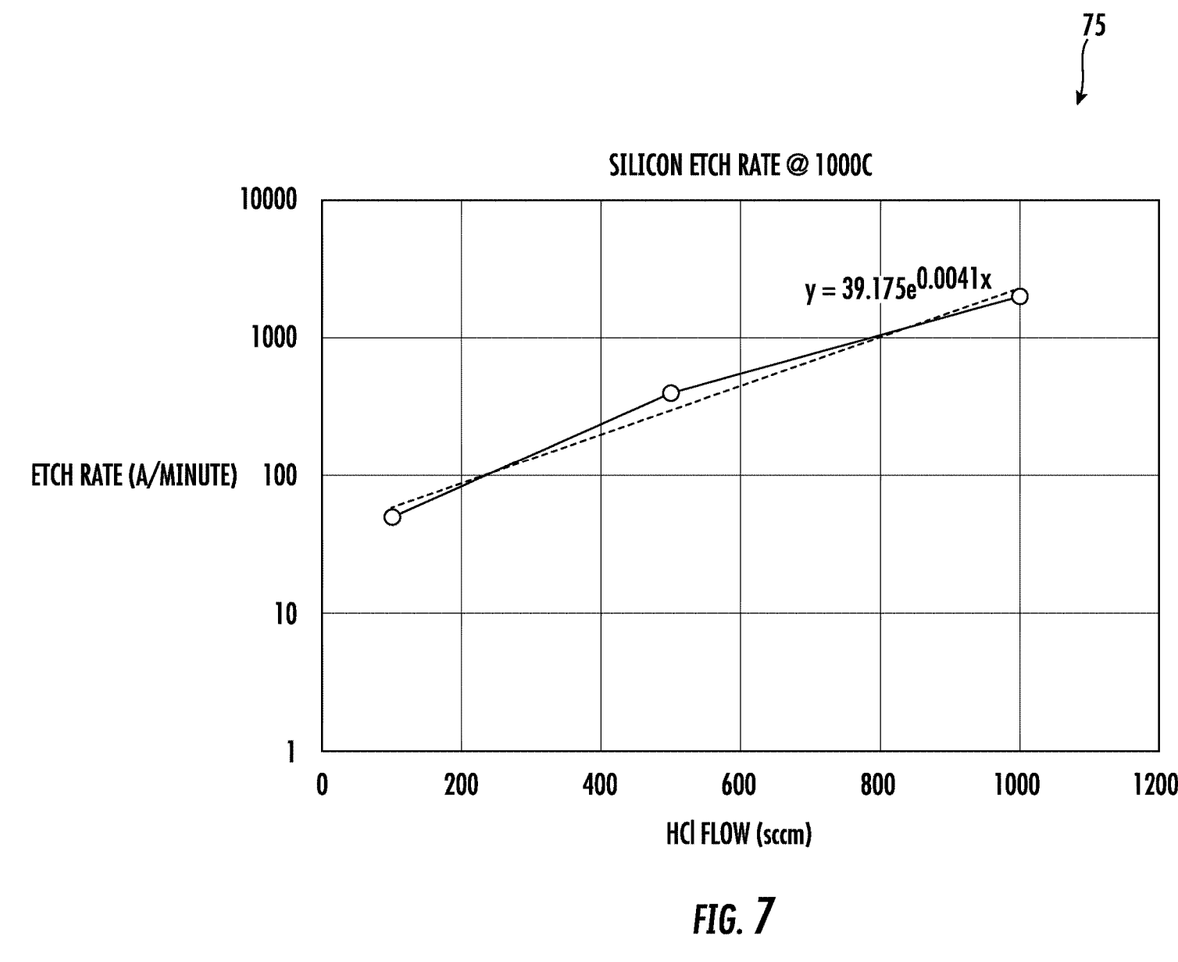
FIG. 7 is a graph of etch rate vs. HCl flow for example in-situ etch parameters for the method of FIG. 5.

Effects of surface roughness vs. etch temperature are shown in plots 70 and 71 of FIGS. 6A-6B for 1×1 μm and 10×10 μm scan sizes, respectively. The AFM roughness of the 1 liter HCl etch on P− wafers (10 μm) was measured, and ~1000° C. AFM was found to be better than the rest 1 μm.

Etch conditions were at a temperature of 1000° C., atmospheric etch, with 40 liters of $H_2$ and then HCl flows from 100-1000 sccm. These conditions provided a thinned silicon surface equal to that of the starting silicon, and a silicon etch rate from about 5 to 200 nm/minute A graph 75 of example silicon etch rates at 1000° C. is provided in FIG. 7. However, it should be noted that other conditions may be used in different embodiments.

Figure 8:
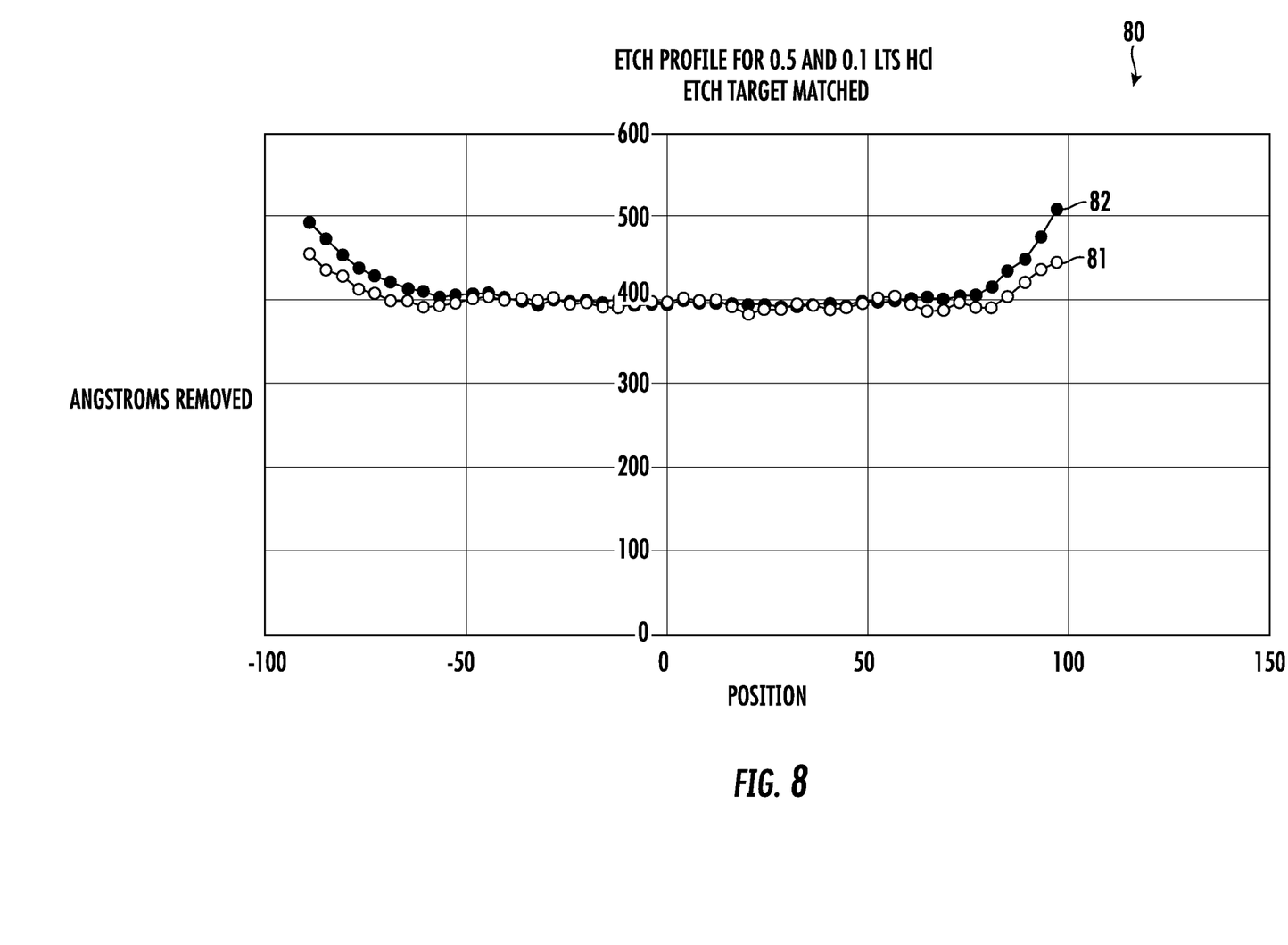
FIG. 8 is a graph of etch thickness vs. position for different example HCl gas flow rates which may be used with the method of FIG. 5.

In the graph 80 of FIG. 8, the results of different etch rates of uniform SOI wafers are shown. The plot line 81 corresponds to a high flow rate of 0.5 liter HCl flow (sccm), and the plot line 82 corresponds to a low flow rate of 0.1 liter HCl flow (sccm), which respectively resulted in 320 angstroms/minute and 40 angstroms/minute etch rates.

Figure 9:
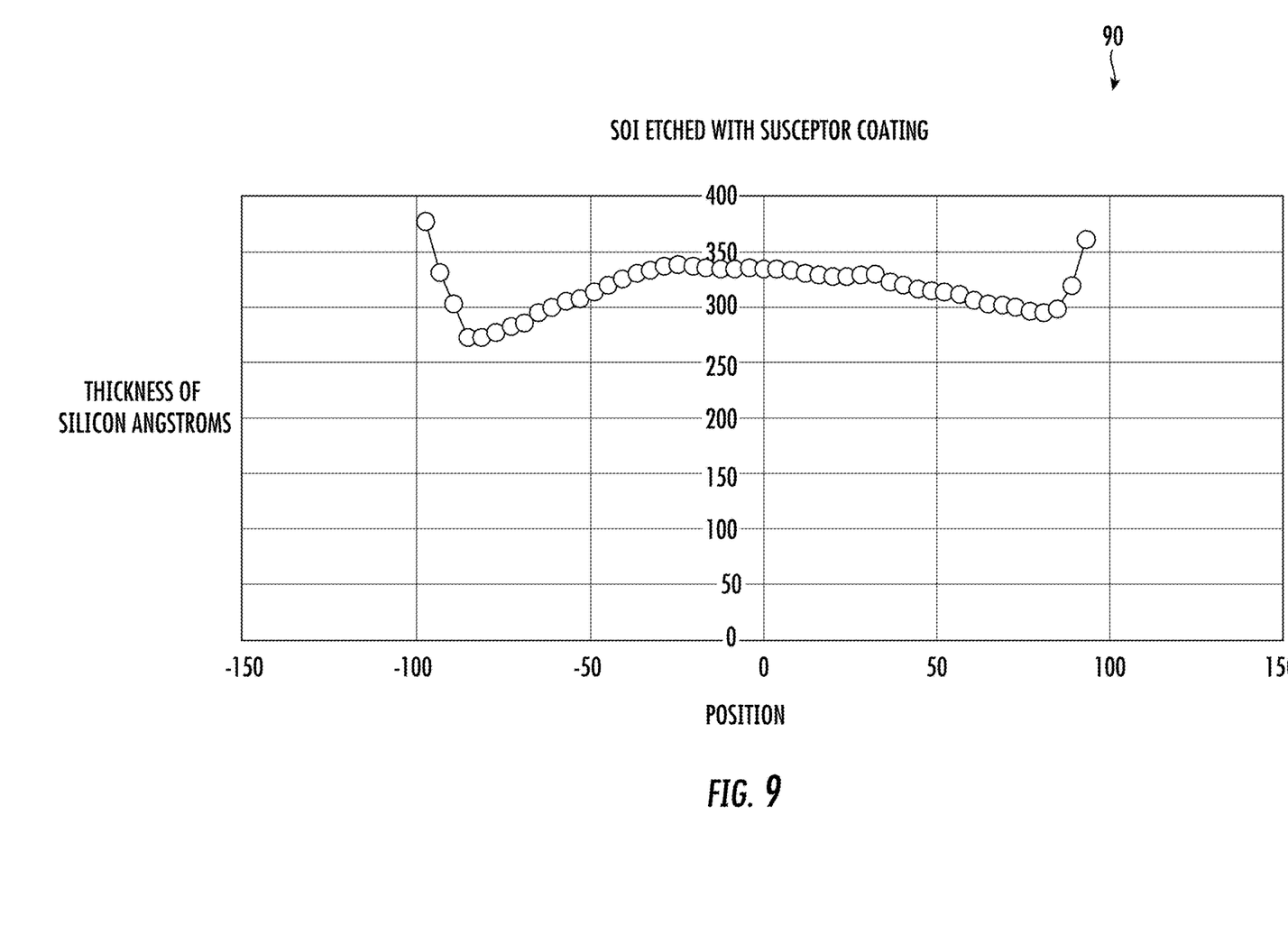
FIG. 9 is a graph of etch thickness vs. position illustrating an example etch step using a susceptor coating in accordance with the method of FIG. 5.
Figure 10:
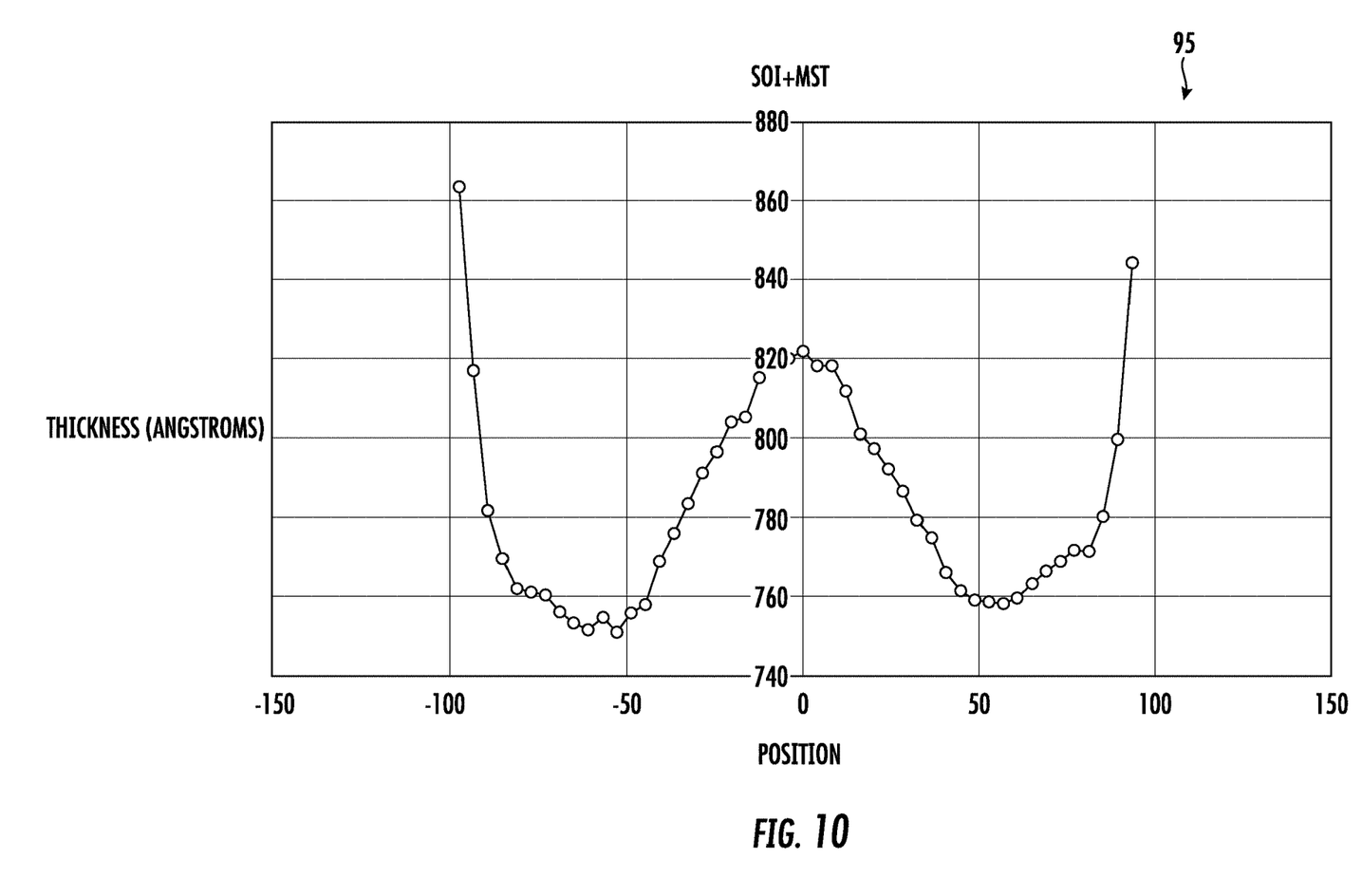
FIG. 10 is a graph of thickness vs. position for an example semiconductor device including a superlattice layer formed using the method of FIG. 5.

In some embodiments, a susceptor coating may be utilized, which allows for more uniform etching of the SOI wafer without removing excessive silicon from the edges of the wafer. The graph 90 of FIG. 9 illustrates a test in which a susceptor coating was used with the above-described etch process. The resulting uniformity is similar to that of the starting SOI wafer.

Once the desired thickness of silicon 103 on the BOX layer 102 is obtained, the MST layer 25 deposition process described above may be run. This puts the MST layer 25 close to the BOX layer 102 of the SOI wafer 100, as seen in the graph 95 of FIG. 10. As noted above, a selectable thickness of silicon (e.g., cap layer 52) may be grown on top of the MST layer 25. The entire process is completed in one epitaxy tool, and the SOI wafer may then be unloaded as an RFSOI-ready wafer already including the MST film. However, in some embodiments further processing may also be performed within the same tool to define additional circuitry on the wafer, if desired.

With respect to technical advantages, thinning of the SOI wafer in the epi tool followed by the growth of the MST layers may result in fewer defects. The thinning of silicon does not undercut the BOX layer, and by using a high temperature bake on the wafer rather than a wet clean, this may result in a cleaner wafer surface. The thinning may also be customized to individual device specifications for respective applications, followed with the deposition of the MST film and cap.

It should be noted that the process examples described above were run in an epi tool at atmospheric conditions, but the present approach may be implemented in other epi tools at other pressure ranges, e.g., sub-atmospheric conditions in a range of 400-700 Torr or otherwise.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a semiconductor device comprising:
   in an epitaxial deposition tool,
   performing an anneal on a semiconductor on insulator (SOI) substrate comprising a first semiconductor layer, an insulating layer on the first semiconductor layer, and a second semiconductor layer on the insulating layer, the second semiconductor layer having a first thickness,
   performing an in-situ etch at a temperature in a range of 950° C. to 1050° C. to reduce the second semiconductor layer to a second thickness less than the first thickness and with a haze in a range of 0.235 to 0.5 PPM, and
   forming a superlattice layer on the second semiconductor layer, the superlattice layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 wherein the first thickness is in a range of 30 nm to 90 nm.

3. The method of claim 1 wherein the second thickness is in a range of 10 nm to 20 nm.

4. The method of claim 1 wherein performing the anneal comprises annealing the SOI substrate at a temperature greater than 1000° C.

5. The method of claim 1 wherein performing the anneal comprises annealing the SOI substrate in a hydrogen environment.

6. The method of claim 1 wherein performing the in-situ etch comprises performing an in-situ HCl etch.

7. The method of claim 6 wherein performing the in-situ HCl etch comprises introducing an HCl gas flow in a range of 100-1000 sccm.

8. The method of claim 1 wherein performing the in-situ etch comprises performing the in-situ at an etch rate in a range of 5-200 nm per minute.

9. The method of claim 1 further comprising epitaxially forming a third semiconductor layer on the superlattice layer, and forming at least one semiconductor circuit in the third semiconductor layer.

10. The method of claim 1 wherein the base semiconductor monolayers comprise silicon.

11. The method of claim 1 wherein the non-semiconductor monolayers comprise oxygen.

12. A method for making a semiconductor device comprising:
    in an epitaxial deposition tool,
    performing an anneal on a semiconductor on insulator (SOI) substrate comprising a first semiconductor layer, an insulating layer on the first semiconductor layer, and a second semiconductor layer on the insulating layer, the second semiconductor layer having a first thickness,
    performing an in-situ etch at a temperature in a range of 950° C. to 1050° C. to reduce the second semiconductor layer to a second thickness less than the first thickness and with a haze in a range of 0.235 to 0.5 PPM,
    forming a superlattice layer on the second semiconductor layer, the superlattice layer comprising a plurality of stacked groups of layers, each group of layers comprising a plurality of stacked base silicon monolayers defining a base silicon portion, and at least one oxygen monolayer constrained within a crystal lattice of adjacent base silicon portions, and
    epitaxially forming a third semiconductor layer on the superlattice layer; and
    forming at least one semiconductor circuit in the third semiconductor layer.

13. The method of claim 12 wherein the first thickness is in a range of 30 nm to 90 nm.

14. The method of claim 12 wherein the second thickness is in a range of 10 nm to 20 nm.

15. The method of claim 12 wherein performing the anneal comprises annealing the SOI substrate at a temperature greater than 1000° C. in a hydrogen environment.

16. The method of claim 12 wherein performing the in-situ etch comprises performing an in-situ HCl etch.

17. The method of claim 16 wherein performing the in-situ HCl etch comprises introducing an HCl gas flow in a range of 100-1000 sccm.

18. The method of claim 12 wherein performing the in-situ etch comprises performing the in-situ etch at an etch rate in a range of 5-200 nm per minute.

19. The method of claim 12 further comprising forming a coating on the first semiconductor layer prior to performing the in-situ etch.

* * * * *